(12) United States Patent
Harada et al.

(10) Patent No.: US 7,733,665 B2
(45) Date of Patent: Jun. 8, 2010

(54) MULTI-LAYER SUBSTRATE HAVING CONDUCTIVE PATTERN AND RESIN FILM AND METHOD FOR MANUFACTURING THE SAME

(75) Inventors: Toshikazu Harada, Kariya (JP); Kouji Kondo, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 570 days.

(21) Appl. No.: 11/431,572

(22) Filed: May 11, 2006

(65) Prior Publication Data

US 2006/0278963 A1 Dec. 14, 2006

(30) Foreign Application Priority Data

Jun. 9, 2005 (JP) .............................. 2005-170005

(51) Int. Cl.
*H05K 1/11* (2006.01)
(52) U.S. Cl. ...................... 361/795; 174/262; 174/260; 174/258; 174/256; 174/255; 361/790; 361/792; 361/794
(58) Field of Classification Search ................. 257/678; 174/250, 257, 261, 254, 255, 256, 263, 260, 174/262, 264, 265, 266, 259; 361/767, 777, 361/800, 816, 818, 760, 748, 790, 794, 795, 361/785, 792, 793, 746, 750, 762
See application file for complete search history.

(56) References Cited

U.S. PATENT DOCUMENTS

| | | | | |
|---|---|---|---|---|
| 5,664,590 | A * | 9/1997 | Plateroti et al. ............. | 132/270 |
| 6,534,723 | B1 * | 3/2003 | Asai et al. ................... | 174/255 |
| 6,667,443 | B2 | 12/2003 | Kondo et al. | |
| 7,012,197 | B2 | 3/2006 | Harada et al. | |
| 2002/0153164 | A1 * | 10/2002 | Cheng ........................ | 174/255 |
| 2002/0189859 | A1 * | 12/2002 | Shiraishi et al. ............. | 174/261 |
| 2004/0156177 | A1 * | 8/2004 | Higashitani ................. | 361/777 |
| 2004/0229024 | A1 | 11/2004 | Harada et al. | |
| 2005/0082087 | A1 * | 4/2005 | Geva et al. ................... | 174/255 |
| 2005/0087363 | A1 * | 4/2005 | Tsukahara et al. .......... | 174/257 |

(Continued)

FOREIGN PATENT DOCUMENTS

JP       A-S63-205995       8/1988

(Continued)

OTHER PUBLICATIONS

Office Action issued Jun. 18, 2008 in corresponding Japanese Patent Application No. 2005-170005 (and English translation).

(Continued)

*Primary Examiner*—Dameon E Levi
*Assistant Examiner*—Hoa C Nguyen
(74) *Attorney, Agent, or Firm*—Posz Law Group, PLC (57) ABSTRACT

A multi-layer substrate connecting to an external electric device includes: a plurality of resin films; and a plurality of conductive patterns. The resin films are stacked together with the conductive patterns. The conductive pattern includes an inner conductive pattern and a surface conductive pattern. The inner conductive pattern is disposed inside of the multi-layer substrate for providing an inner circuit. The surface conductive pattern is exposed on the multi-layer substrate for connecting to the external electric device. The surface conductive pattern has a thickness in a stacking direction, which is thicker than a thickness of the inner conductive pattern.

12 Claims, 3 Drawing Sheets

U.S. PATENT DOCUMENTS

2005/0100719 A1* 5/2005 Kanakarajan et al. ....... 428/209
2005/0186406 A1 8/2005 Harada et al.

FOREIGN PATENT DOCUMENTS

| JP | 05275855 A * | 10/1993 | ................. 29/851 |
|---|---|---|---|
| JP | A-07-202439 | 8/1995 | |
| JP | A-9-307205 | 11/1997 | |
| JP | A-2002-299840 | 10/2002 | |
| JP | A-2003-060348 | 2/2003 | |
| JP | A-2005-012126 | 1/2005 | |
| JP | A-2005-72187 | 3/2005 | |
| JP | A-2005-123269 | 5/2005 | |

OTHER PUBLICATIONS

Office Action dated Feb. 10, 2009 in corresponding Japanese patent application No. 2005-170005 (and English translation).

Office Action dated Aug. 26, 2009 in corresponding Taiwan patent application No. 095118482 (and English translation).

Office Action mailed Jan. 21, 2010 from the Taiwanese Patent Office in the corresponding Taiwan Invention Patent Application No. 95118482 (English translation enclosed).

* cited by examiner

MULTI-LAYER SUBSTRATE HAVING CONDUCTIVE PATTERN AND RESIN FILM AND METHOD FOR MANUFACTURING THE SAME

CROSS REFERENCE TO RELATED APPLICATION

This application is based on Japanese Patent Application No. 2005-170005 filed on Jun. 9, 2005, the disclosure of which is incorporated herein by reference.

FIELD OF THE INVENTION

The present invention relates to a multi-layer substrate having a conductive pattern and a resin film and a method for manufacturing the same.

BACKGROUND OF THE INVENTION

A multi-layer substrate having a conductive pattern and a resin film and a method for manufacturing the same are disclosed in, for example, U.S. Pat. No. 6,667,443-B2. In the multi-layer substrate, multiple thermoplastic resin films are stacked and multiple conductive patterns are formed among the resin films. Specifically, each resin film is made of thermoplastic resin, and each conductive pattern is formed on one side of the resin film so that a one-side conductive pattern film is formed. Multiple one-side conductive pattern films are stacked, and then, the stacked films are pressed and heated from both surfaces of the stacked films. Thus, the one-side conductive pattern films are bonded together.

In order to pack the multi-layer substrate densely, it is preferred that a surface conductive pattern disposed on the surface of the multi-layer substrate has a small thickness and a small area. Here, the surface conductive pattern of the multi-layer substrate is exposed outside. And an inner conductive pattern is disposed inside of the multi-layer substrate. Thus, the conductive patterns of the multi-layer substrate are composed of the surface conductive pattern and the inner conductive patter. However, in the above substrate disclosed in U.S. Pat. No. 6,667,443-B2, in order to simplify the construction of the multi-layer substrate, all conductive patterns are formed by an etching method. Specifically, a metallic film having a predetermined thickness is etched so that the conductive pattern is formed. Accordingly, the thickness of the surface conductive pattern is substantially equal to the thickness of the inner conductive pattern. In a case where the thickness of the surface conductive pattern is thin, connection reliability of the multi-layer substrate may be reduced by solder erosion when a land of the surface conductive pattern is bonded to an electrode of an electric device through the solder.

SUMMARY OF THE INVENTION

In view of the above-described problem, it is an object of the present invention to provide a multi-layer substrate having high connection reliability. It is another object of the present invention to provide a method for manufacturing a multi-layer substrate having high connection reliability.

A multi-layer substrate connecting to an external electric device includes: a plurality of resin films having electric insulation property; and a plurality of conductive patterns disposed on the resin films. The resin films are stacked together with the conductive patterns. The conductive pattern includes an inner conductive pattern and a surface conductive pattern. The inner conductive pattern is disposed inside of the multi-layer substrate so that the inner conductive pattern provides an inner circuit. The surface conductive pattern is exposed on the multi-layer substrate so that the surface conductive pattern is capable of connecting to the external electric device. The surface conductive pattern has a thickness in a stacking direction perpendicular to the multi-layer substrate. The thickness of the surface conductive pattern is thicker than a thickness of the inner conductive pattern in the stacking direction.

In the above substrate, the surface conductive pattern is prevented from breaking caused by solder erosion when the electric device is soldered on the surface conductive pattern. Thus, the connection reliability of the conductive pattern is improved, i.e., the substrate has high connection reliability. Further, the total thickness of the substrate is comparatively thin, and the flexibility of the substrate is comparatively high. Alternatively, the surface conductive pattern may include a land and a wiring.

Further, a method for manufacturing a multi-layer substrate connecting to an external electric device is provided. The substrate includes a plurality of resin films having electric insulation property and a plurality of conductive patterns disposed on the resin films. The resin films are stacked together with the conductive patterns. The resin film includes a first resin film and a second resin film. The conductive pattern includes an inner conductive pattern and a surface conductive pattern. The method includes the steps of: preparing an inner conductive pattern film having the inner conductive pattern, which is formed on at least one side of the first resin film; preparing a surface conductive pattern film having the surface conductive pattern, which is formed on one side of the second resin film, wherein the surface conductive pattern has a thickness in a stacking direction perpendicular to the multi-layer substrate, and wherein the thickness of the surface conductive pattern is thicker than a thickness of the inner conductive patter in the stacking direction; stacking the resin films including the inner conductive pattern film and the surface conductive pattern film in such a manner that the surface conductive pattern is exposed on the multi-layer substrate, wherein the stacked resin films provide a stack construction; and heating and pressurizing the stack construction so that the resin films are bonded together.

In the above substrate, the surface conductive pattern is prevented from breaking caused by solder erosion when the electric device is soldered on the surface conductive pattern. Thus, the connection reliability of the conductive pattern is improved, i.e., the substrate has high connection reliability. Further, the total thickness of the substrate is comparatively thin, and the flexibility of the substrate is comparatively high. Alternatively, the surface conductive pattern may include a land and a wiring.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
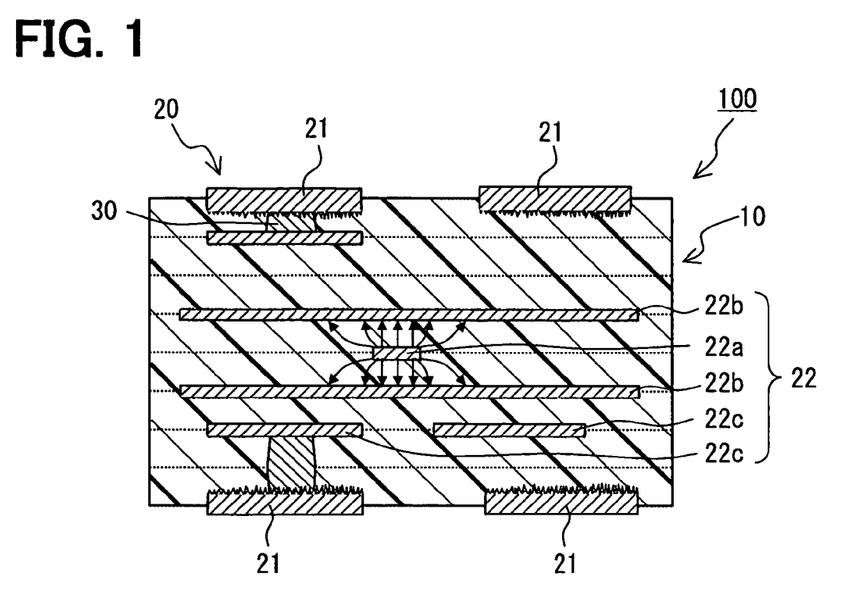
FIG. 1 is a cross sectional view showing a multi-layer substrate according to a first embodiment of the present invention.

FIG. 1 shows a multi-layer substrate 100 according to a first embodiment of the present invention. The substrate 100 includes multiple resin films 10 having electrical insulation property. The resin films 10 provide multiple layers in the substrate 100. A conductive pattern 20 is formed on the resin film 10. Thus, multiple conductive patterns 20 are disposed between the resin films 10, and the conductive patterns 20 and the resin films 10 are stacked.

The material and the thickness of each resin film 10 may be different from those shown in FIG. 1. Alternatively, the resin film 10 may be made of thermoplastic resin or thermosetting resin. Further, the substrate 100 may include both of a thermoplastic resin film and a thermosetting resin film. In FIG. 1, the resin film 10 is made of liquid crystal polymer (i.e., LCP), and the thickness of the resin film 10 is about 50 μm. Eight resin films 10 are stacked and bonded together, so that the multi-layer substrate 100 is formed. In this case, since the resin film 10 is made of only thermoplastic resin, the specific permittivity of the substrate 100 is low, and high frequency characteristic of the substrate 100 is excellent.

The conductive pattern 20 is formed on one side of the resin film 10, or on both sides of the resin film 10. The conductive pattern 20 is made of low resistance metallic material such as Au, Ag, Cu, and Al. In FIG. 1, the conductive pattern 20 is formed on one side of the resin film 10 so that a one-side conductive pattern film is formed. The conductive pattern 20 is made of copper. Specifically, a copper film bonded on the one side of the resin film 10 is etched so that the copper film provides the conductive pattern 20 having a predetermined pattern. Thus, the conductive pattern 20 is formed by an etching method of a metallic film. Alternatively, the conductive pattern 20 may be formed by a printing method of a metallic film having a predetermined pattern.

The conductive pattern 20 includes a surface conductive pattern 21 and an inner conductive pattern 22. The surface conductive pattern 21 is disposed on the surface of the multi-layer substrate 100 so that the surface conductive pattern 21 is exposed outside of the substrate 100, i.e., the surface conductive pattern is exposed on the substrate 100. The surface conductive pattern 21 provides an electrode, i.e., a land of the substrate 100. The inner conductive pattern 22 is disposed inside of the substrate 100. The thickness of the surface conductive pattern 21 is thicker than that of the inner conductive pattern 22. Specifically, the thickness of the surface conductive pattern 21 is about 35 μm, and the thickness of the inner conductive pattern 22 is about 12 μm. Accordingly, connection reliability of the substrate 100 is improved, compared with a case where the thickness of each of the conductive patterns is equalized (e.g., the thicknesses of all conductive patterns are equalized to be 12 μm). Specifically, solder erosion of the surface conductive pattern 21 is prevented when an electric device is mounted on the substrate 100. Accordingly, the substrate 100 has high connection reliability. Further, in FIG. 1, the surface conductive pattern 21 exposed on the surface of the substrate 100 is composed of only the land. A wiring composed of the inner conductive pattern 22 is disposed in the substrate 100. Accordingly, the substrate has high resistance against breaking of wire.

If the thicknesses of all conductive patterns are equalized to be, for example, 35 μm, the connection reliability of a multi-layer substrate is also improved. However, in this case, the total thickness of the multi-layer substrate becomes thick, so that flexibility of the substrate is reduced. On the other hand, in this embodiment, only the thickness of the surface conductive pattern 21 is thick, and therefore, the total thickness of the multi-layer substrate 100 becomes thinner, compared with a case where the thicknesses of all conductive patterns are equalized to be thick. Further, the flexibility of the substrate 100 is sufficiently secured.

Further, as shown in FIG. 1, a surface roughness of one side of the surface conductive pattern 21 is larger than a surface roughness of the inner conductive pattern 22, the one side of the surface conductive pattern 21 contacting (i.e., bonding) the resin film 10. Therefore, the surface conductive pattern 21 has sufficient anchor effect so that the surface conductive pattern 21 is strongly bonded to the resin film 10. Accordingly, although the surface conductive pattern 21 is exposed on the surface of the multi-layer substrate 100, the surface conductive pattern 21 is prevented from peeling off. The inner conductive pattern 22 is disposed inside of the substrate 100. Therefore, an external force for peeling off the pattern 22 is not applied to the inner conductive pattern 22. Thus, the conductive pattern 20 including the surface conductive pattern 21 and the inner conductive pattern 22 is prevented from peeling off. Thus, the connection reliability of the conductive pattern 20 is improved. Here, the surface roughness of the surface conductive pattern 21 having a large thickness is larger than that of the inner conductive pattern 22 having a small thickness. Several methods may be used for surface treatment of enlarging the surface roughness of the surface conductive pattern 21.

Further, the inner conductive pattern 22 includes a strip conductive pattern 22a and a ground conductive pattern 22b, which provide a high frequency circuit. In a stacking direction perpendicular to the surface of the substrate 100, a pair of the ground conductive patterns 22b is disposed on both sides of the strip conductive pattern 22a through the resin film 10 so that a strip line construction is formed. Thus, a high frequency signal is transmitted through the strip line construction. Regarding the high frequency signal transmitting through the strip line construction, electric field of the high frequency signal is shown as an arrow in FIG. 1. Thus, when the high frequency signal is transmitted, a high frequency current flows near the surface of the strip conductive pattern 22a and the surface of the ground conductive pattern 22b, which face each other. This current flow is caused by skin effect. Here, since the surface roughness of each of the strip conductive pattern 22a and the ground conductive pattern 22b is smaller than that of the surface conductive pattern 21, the high frequency circuit composed of the strip conductive pattern 22a and the ground conductive pattern 22b has small transmitting loss of the high frequency signal. In the substrate 100, the transmitting loss caused by the surface roughness of the strip line construction is small. Accordingly, the substrate 100 is suitably used for the high frequency circuit. Here, a relationship between the surface roughness of the conductive pattern 20 and the high frequency circuit is described in US Patent Application Publication No. 2004/0229024-A1. The inner conductive pattern 22 further includes a normal conductive pattern 22c, which transmits a low frequency signal having a low frequency lower than that of the high frequency signal. A connection member 30 is formed in a through hole of the resin film 10. The connection member 30 electrically connects between the conductive patterns 20, which are disposed on different layers of the substrate 100.

Figure 2:
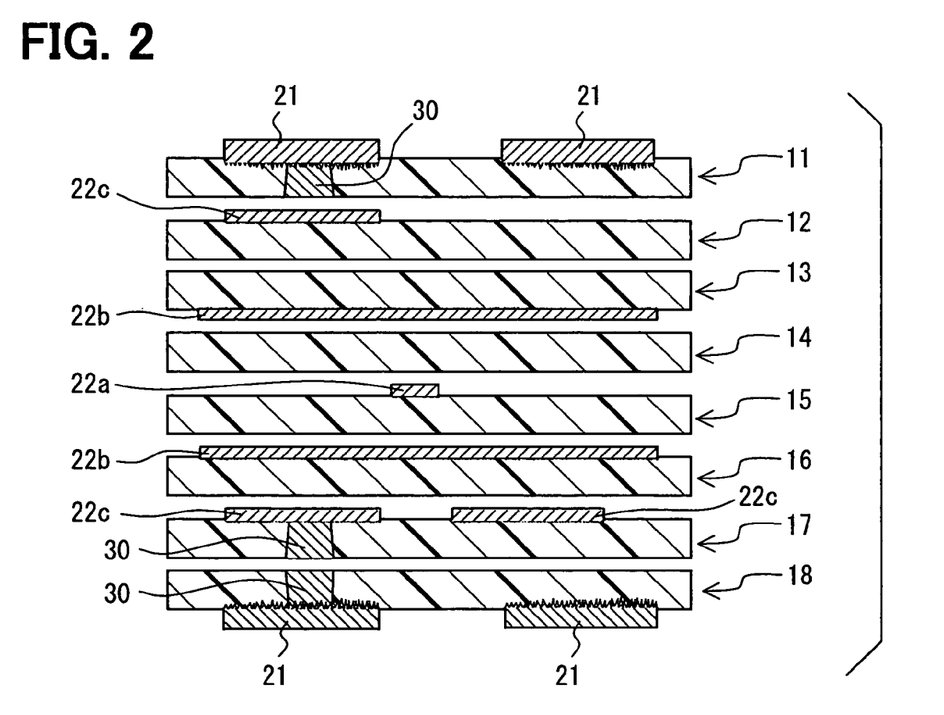
FIG. 2 is an exploded cross sectional view showing multiple layers composing the substrate, according to the first embodiment.
Figure 3:
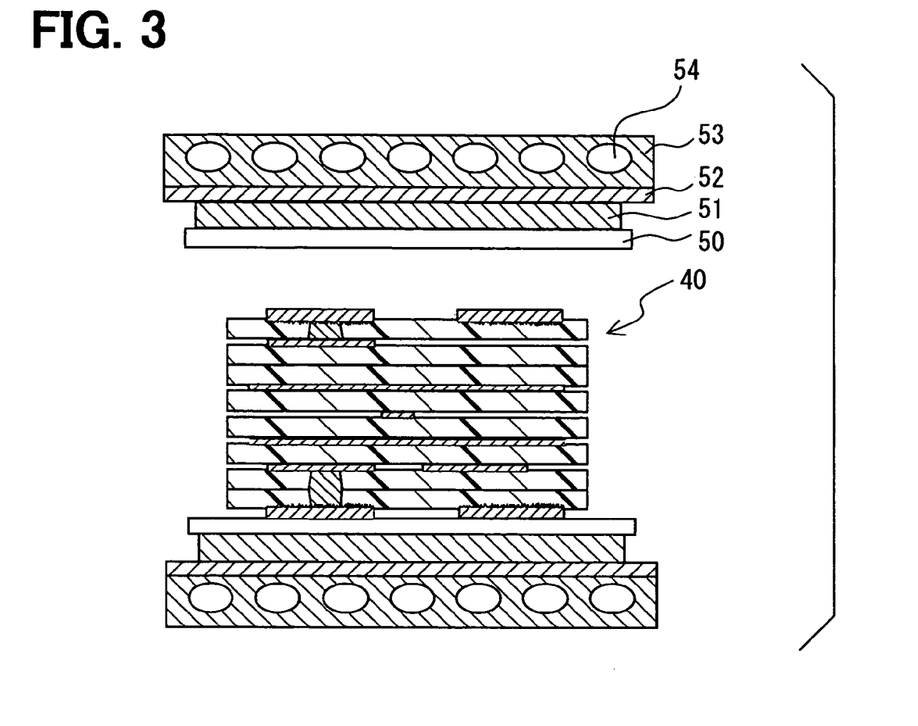
FIG. 3 is a cross sectional view explaining a heating and pressurizing step of a manufacturing process of the substrate, according to the first embodiment.

The manufacturing method of the multi-layer substrate 100 is described below with reference to FIGS. 1-3. FIG. 2 is an exploded cross sectional view explaining each component in the multi-layer substrate 100. FIG. 3 explains a pressuring and heating step for heating and pressurizing the components so that the multi-layer substrate 100 is formed.

Firstly, a preparation step for preparing the resin film 10 having the conductive pattern 20 is performed. The conductive pattern 20 is formed on one side of the resin film 10. In this embodiment, eight resin films 10 providing resin layers of the substrate 100 are made of LCP, i.e., liquid crystal polymer, and the thickness of each resin film 10 is about 50 μm. The thickness of a copper film bonded on one side of the resin film 10 is different between the surface conductive pattern 21 and the inner conductive pattern 22. Further, the surface roughness of the copper film is also different between the surface conductive pattern 21 and the inner conductive pattern 22. Specifically, the surface roughness of one side of the surface conductive pattern 21 is different from that of one side of the inner conductive pattern 22, the one side facing and bonding the resin film 10. The copper film having the thickness of 35 μm is bonded to one side of the resin film 10 by a hot press method. One side of the copper film having the thickness of 35 μm has a large surface roughness, and the one side of the copper film provides a bonding surface to be bonded to the resin film 10. Then, the copper film is etched so that a predetermined pattern is formed. Thus, a surface conductive pattern film 11, 18 having the surface conductive pattern 21 is formed. Another copper film having the thickness of 12 μm is bonded to one side of the resin film 10 by a hot press method. One side of the copper film having the thickness of 12 μm has a small surface roughness, and the one side of the copper film provides a bonding surface to be bonded to the resin film 10. Then, the copper film is etched so that a predetermined pattern is formed. Thus, an inner conductive pattern film 12-13, 15-17 having the inner conductive pattern 22, 22a-22c other than an inner resin film 14 is formed. Here, the copper film is a copper electrolysis film, and the surface roughness of the copper film is controlled to be a predetermined value in a step of forming the copper film and/or in a step of surface treatment. The inner resin film 14 has no conductive pattern 20.

After the conductive pattern 20 is formed, a via hole having a bottom is formed at a predetermined position in the resin film 10 by using, for example, a laser beam drilling method. The bottom of the via hole is provided by the conductive pattern 20. A conductive paste for the connection member is inserted into the via hole. The connection member connects between the conductive patterns in different layers of the substrate 100. The conductive paste is sintered in a heating/pressurizing step so that the connection member 30 is formed. Thus, in the preparation step, the resin film 10 as a component of multi layers of the substrate 100 is prepared.

Next, a stacking step is performed. The pattern films 11-13, 15-18 having the conductive patterns 20 and the inner resin film 14 having no conductive pattern 20 are stacked so that a stacked construction 40 is formed. The pattern films 11-13, 15-18 and the inner resin film 14 are stacked in a predetermined order and a predetermined orientation.

After the step of stacking, as shown in FIG. 3, the stacked construction 40 is heated and pressurized by a hot press method. Specifically, both sides of the stacked construction 40 are pressed and heated by a hot press plate 54. The heating temperature is, for example, in a range between 250° C. and 400° C., and the pressure is, for example, in a range between 1 MPa and 10 MPa. The stacked construction 40 is pressed and heated during a predetermined time, for example a few tens seconds. Here, the stacked construction 40 is sandwiched between a pair of the hot press plates 53 through an adhesion prevention film 50, a buffer member 51 and a metallic plate 52. Each hot press plate 53 includes a heater 54 inside thereof. Thus, the films 11-18 are softened and bonded together. Thus, the resin films 10 composed of the films 11-18 are bonded and integrated so that the multi-layer substrate 100 is formed. In this case, the conductive paste in the via hole is sintered so that the connection member 30 is formed. Further, the connection member 30 connects between two neighboring conductive patterns 20 by diffusion bonding phenomenon.

The adhesion prevention film 50 protects the films 11-18 from adhering to other elements in the step of heating and pressurizing. Further, the adhesion prevention film 50 protects the films 11-18 from being damaged. For, example, the adhesion prevention film 50 is made of resin film having high heat resistance. The buffer member 51 is used for pressurizing each film 11-18 homogeneously in the step of heating and pressurizing. For example, the buffer member 51 is made of a forming member, which is formed from fibrous metal. The fibrous metal is prepared such that metallic material such as stainless steel is cut into the fibrous metal. The metallic plate 52 protects the hot press plate 53 from being damaged. The metallic plate 52 is made of, for example, stainless steel or titanium. Although the stacked construction 40 is heated and pressurized by a pair of the hot press plates 53, the stacked construction 40 may be heated and pressurized by another method and another equipment.

After the hot press step, the heated and pressurized stacked construction 40 is cooled in a cooling step. Thus, the multi-layer substrate 100 is formed. The above manufacturing method of the multi-layer substrate 100 provides a simple manufacturing process, since stacked films 11-18 can be bonded at the same time. Thus, the manufacturing cost of the substrate 100 is reduced.

After the substrate 100 is formed, an electric device is mounted on the substrate 100. When the electric device is mounted on the substrate 100, an electrode of the electric device is bonded to the surface conductive pattern 21 as the land of the substrate 100 through a solder. In this case, the solder erosion in the substrate 100 is small, so that the connection reliability of the substrate 100 and the electric device is improved.

Figure 4:
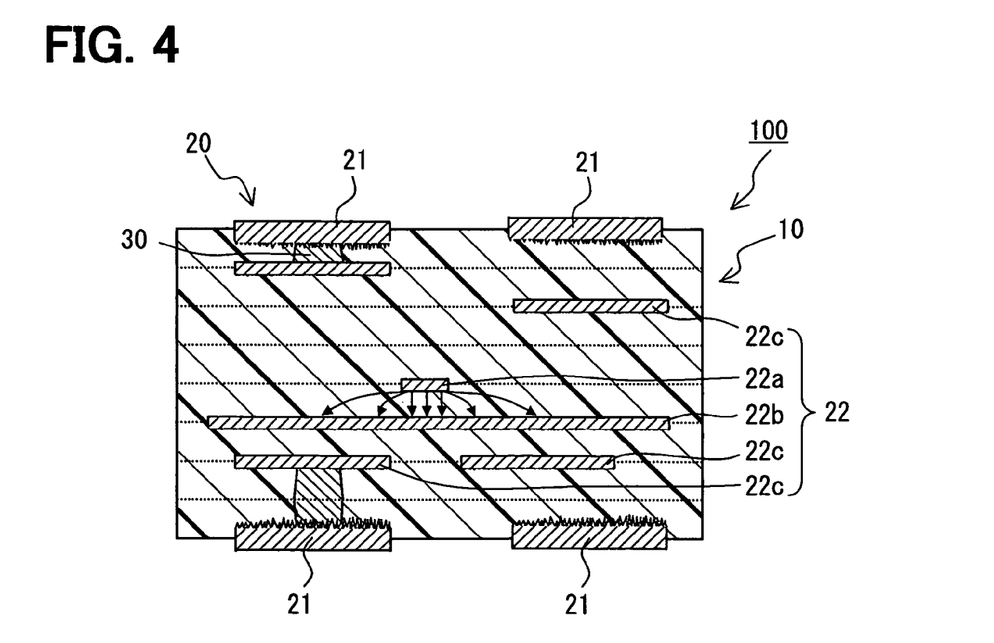
FIG. 4 is a cross sectional view showing a multi-layer substrate according to a modification of the first embodiment of the present invention.

Although the substrate 100 includes the strip conductive pattern 22a and the ground conductive pattern 22b providing the strip line construction, the high frequency circuit composed of the inner conductive pattern 22 may be provided by another pattern. For example, as shown in FIG. 4, the high frequency circuit may be a micro-strip line construction, which is composed of one ground conductive pattern 22b and the strip conductive pattern 22a. Specifically, the one ground conductive pattern 22b is disposed on one side of the strip conductive pattern 22a through the resin film 10 in a stacking direction perpendicular to the substrate 100. In this case, electric field is shown as an arrow in FIG. 4.

Second Embodiment

Figure 5:
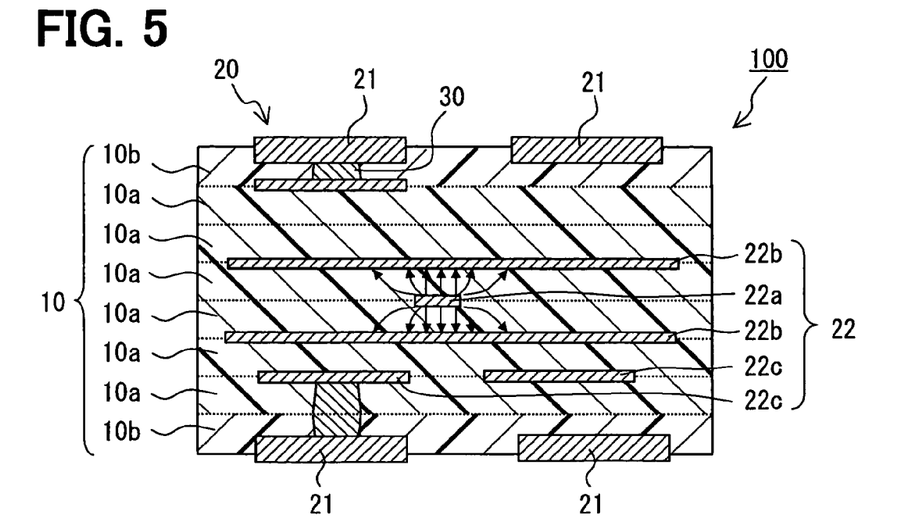
FIG. 5 is a cross sectional view showing a multi-layer substrate according to a second embodiment of the present invention.
Figure 6:
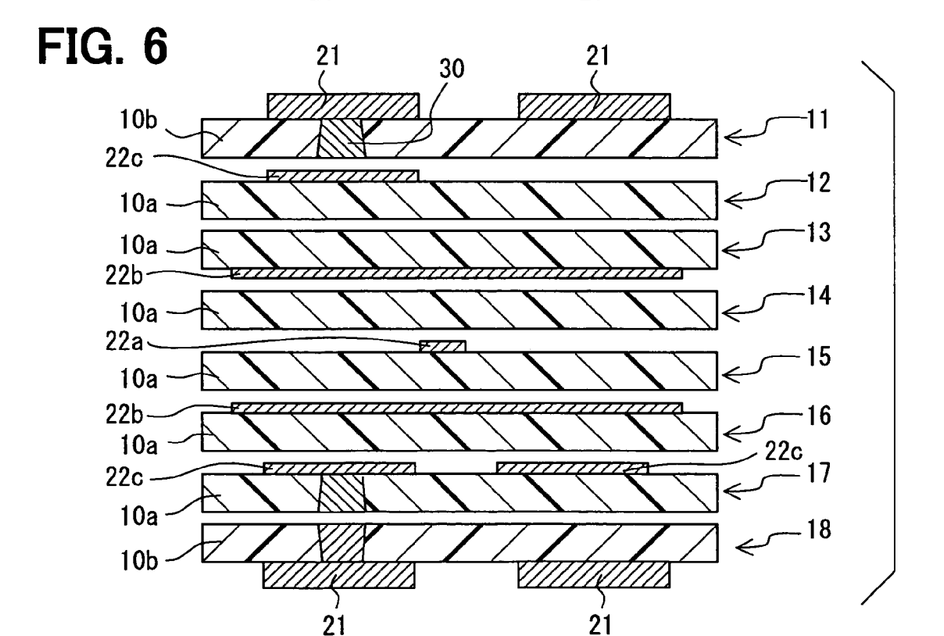
FIG. 6 is an exploded cross sectional view showing multiple layers composing the substrate, according to the second embodiment.

FIGS. 5 and 6 show a multi-layer substrate 100 according to a second embodiment of the present invention. In the substrate 100, the thickness of the surface conductive pattern 21 exposed on the substrate 100 is thicker than that of the inner conductive pattern 22 disposed inside of the substrate 100. Accordingly, the connection reliability of the substrate 100 against the solder erosion is improved.

In FIGS. 5 and 6, the surface conductive pattern 11, 18 is formed from a second resin film 10b, and the inner conductive pattern 12-17 is formed from a first resin film 10a. The second resin film 10b is made of a second resin material having heat resistance higher than heat resistance of a first resin material composing the first resin film 10a. The first resin film 10a having a comparatively low heat resistance composing the inner resin film 14 and the inner conductive pattern film 12-13, 15-17 is made of 1.5th-type LCP, which has a melting point of 285° C. The second resin film 10b having a comparatively high heat resistance composing the surface conductive pattern film 11, 18 is made of 1st-type LCP, which has a melting point of 320° C. When the heat resistance of the second resin film 10b is higher than that of the first resin film 10a, fluidity caused by heating and pressurizing can be reduced when the electric device is soldered on the substrate 100. Accordingly, sufficient bonding strength of the surface conductive pattern 21 is secured, so that the connection reliability of the substrate 100 and the electric device is improved. A relationship between the heat resistance and the bonding strength is described in Japanese Patent Application No. 2003-298688.

Further, the inner conductive pattern 20, i.e., the strip conductive pattern 22a and the ground conductive pattern 22b, is disposed in the first resin film 10a made of thermoplastic resin and having a comparatively low specific permittivity. Accordingly, the substrate 100 provides preferable high frequency circuit.

Figure 7:
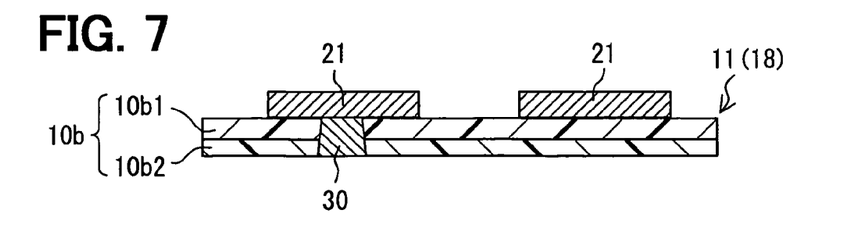
FIG. 7 is a cross sectional view showing a second resin film according to a modification of the second embodiment of the present invention.

In this embodiment, the second resin film 10b is made of thermoplastic. Alternatively, the second resin film 10b may be made of thermosetting resin such as epoxy resin. At least a part of the second resin film 10b, which contacts the surface conductive pattern 21, is made of thermosetting resin or thermoplastic resin having high melting point higher than that of the first resin film 10a. To increase the bonding strength between the surface conductive pattern 21 and the second resin film 10b and to increase adhesiveness between the first resin film 10a and the second resin film 10b, the second resin film 10b may be made from multiple materials. For example, as shown in FIG. 7, the second resin film 10b includes a first layer 10b1 and a second layer 10b2. The surface conductive pattern 21 contacts the first layer 10b1 of the second resin film 10b. The first layer 10b1 is made of thermosetting resin or thermoplastic resin having a high melting point higher than that of the first resin film 10a. The second layer 10b2 of the second resin film 10b may be made of the same material as the first resin film 10a. The second layer 10b2 of the second resin film 10b contacts the first resin film 10a. In this case, the films 11-18 can be easily bonded and integrated.

The substrate 100 shown in FIG. 1 according to the first embodiment may be modified in view of the substrate 100 shown in FIG. 5 or FIG. 7 according to the second embodiment.

Although the surface conductive pattern 21 is the land for connecting to the electrode of the electric device, the surface conductive pattern 21 may be a wiring or the like. Preferably, the inner conductive pattern 22 provides the wiring so that the wiring is prevented from breaking.

Although the substrate 100 includes eight layers, the substrate 100 may have another number of layers such as seven layers or six layers.

Although the resin film 10 is made of thermoplastic resin, i.e., LCP, the resin film 10 may be made of mixture of PEEK (i.e., polyether ether ketone) in a range between 65% and 35% and PEI (i.e., poly ether imide) in a range between 35% and 65%. Alternatively, the resin film 10 may be made of PEEK only or PEI only. Further, alternatively, the resin film 10 may be made of PES (i.e., poly ether sulphone), PPE (i.e., poly phenylene ether), PEN (i.e., poly ethylene naphthalate), or styrene resin having a syndiotactic construction. Alternatively, the resin film 10 may be made of mixture of the above materials including PEEK and PEI. Thus, the material of the resin film 10 may be any material as long as the resin films are bonded in the step of heating and pressurizing and the resin film has sufficient heat resistance in the step of soldering step.

The present inventions has the following aspects.

A multi-layer substrate connecting to an external electric device includes: a plurality of resin films having electric insulation property; and a plurality of conductive patterns disposed on the resin films. The resin films are stacked together with the conductive patterns. The conductive pattern includes an inner conductive pattern and a surface conductive pattern. The inner conductive pattern is disposed inside of the multi-layer substrate so that the inner conductive pattern provides an inner circuit. The surface conductive pattern is exposed on the multi-layer substrate so that the surface conductive pattern is capable of connecting to the external electric device. The surface conductive pattern has a thickness in a stacking direction perpendicular to the multi-layer substrate. The thickness of the surface conductive pattern is thicker than a thickness of the inner conductive pattern in the stacking direction.

In the above substrate, the surface conductive pattern is prevented from breaking caused by solder erosion when the electric device is soldered on the surface conductive pattern. Thus, the connection reliability of the conductive pattern is improved, i.e., the substrate has high connection reliability. Further, the total thickness of the substrate is comparatively thin, and the flexibility of the substrate is comparatively high. Alternatively, the surface conductive pattern may include a land and a wiring.

Alternatively, the surface conductive pattern may have a surface roughness of one side of the surface conductive pattern, the one side contacting the resin film, and the surface roughness of the one side of the surface conductive pattern may be larger than a surface roughness of the inner conductive pattern. In this case, the anchor effect of the surface conductive pattern to the resin film is comparatively large, so that the surface conductive pattern hardly peels off from the surface of the resin film even though the surface conductive pattern is exposed on the substrate. Thus, the substrate has high resistance against peeling off of the conductive pattern. Here, it is easy to increase the surface roughness of the surface conductive pattern since the thickness of the surface conductive pattern is comparatively thick. Further, the inner conductive pattern may include a high frequency circuit construction providing a high frequency circuit as the inner circuit. Here, the surface roughness of the conductive pattern affects high frequency properties of a high frequency signal. Specifically, when the surface roughness of the conductive pattern is large, the surface resistance of the conductive pattern becomes large. Thus, characteristics of a high frequency current flowing through the conductive pattern are deteriorated. As the frequency increases, the high frequency current flows near the surface of the conductive pattern because of skin effect. Thus, as the frequency increases, the surface roughness much affects the high frequency properties. However, in the above substrate, since the surface roughness of the inner conductive pattern is smaller than that of the surface conductive pattern, the inner conductive pattern is superior to the surface conductive pattern regarding the conductive pattern for providing the high frequency circuit. Further, the high frequency circuit construction may include a strip conductive pattern and a pair of a ground conductive patterns. The strip conductive pattern is sandwiched between a pair of the ground conductive patterns through the resin film, and the high frequency circuit construction is a strip line construction. Alternatively, the high frequency circuit construction may include a strip conductive pattern and a ground conductive pattern. The strip conductive pattern faces the ground conductive pattern through the resin film, and the high frequency circuit construction is a micro-strip line construction.

Alternatively, the resin film may include a first resin film and a second resin film. The first resin film is made of thermoplastic resin. The second resin film has a heat resistance, which is higher than a heat resistance of the first resin film. The surface conductive pattern is disposed on the second resin film. The inner conductive pattern is disposed on the first resin film. In this case, since the second resin film has comparatively high heat resistance, the fluidity of the second resin film is lower than that of the first resin film when the electric device is mounted on the substrate in a step of heating and pressurizing. Accordingly, when the second resin film is disposed on the outer side of the substrate, the substrate has sufficient bonding strength.

Alternatively, the second resin film may have a part contacting the surface conductive pattern, and the part of the second resin film is made of thermosetting resin or thermoplastic resin having a melting point higher than the first resin film. In this case, the second resin film is made of multiple types of resin.

Alternatively, the surface conductive pattern may provide only a land for connecting to an electrode of the external electric device, and the inner conductive pattern may provide only a wiring of the inner circuit. In this case, since the wiring is disposed inside of the substrate, the substrate is protected from breaking the wiring even when external impact is applied to the substrate.

Alternatively, the surface conductive pattern may be connected to the electrode of the external electric device with a solder member.

Alternatively, the thickness of the surface conductive pattern may be equal to or more than twice thicker than the thickness of the inner conductive pattern in the stacking direction.

Further, a method for manufacturing a multi-layer substrate connecting to an external electric device is provided. The substrate includes a plurality of resin films having electric insulation property and a plurality of conductive patterns disposed on the resin films. The resin films are stacked together with the conductive patterns. The resin film includes a first resin film and a second resin film. The conductive pattern includes an inner conductive pattern and a surface conductive pattern. The method includes the steps of: preparing an inner conductive pattern film having the inner conductive pattern, which is formed on at least one side of the first resin film; preparing a surface conductive pattern film having the surface conductive pattern, which is formed on one side of the second resin film, wherein the surface conductive pattern has a thickness in a stacking direction perpendicular to the multi-layer substrate, and wherein the thickness of the surface conductive pattern is thicker than a thickness of the inner conductive patter in the stacking direction; stacking the resin films including the inner conductive pattern film and the surface conductive pattern film in such a manner that the surface conductive pattern is exposed on the multi-layer substrate, wherein the stacked resin films provide a stack construction; and heating and pressurizing the stack construction so that the resin films are bonded together.

In the above substrate, the surface conductive pattern is prevented from breaking caused by solder erosion when the electric device is soldered on the surface conductive pattern. Thus, the connection reliability of the conductive pattern is improved, i.e., the substrate has high connection reliability. Further, the total thickness of the substrate is comparatively thin, and the flexibility of the substrate is comparatively high. Alternatively, the surface conductive pattern may include a land and a wiring.

Alternatively, the conductive pattern may be made from a metallic film bonded to the resin film. The metallic film includes a first metallic film and a second metallic film, and the second metallic film providing the surface conductive pattern has a thickness thicker than a thickness of the first metallic film providing the inner conductive pattern.

Alternatively, the second metallic film may have a surface roughness of one side of the second metallic film, the one side contacting the second resin film. The first metallic film may have a surface roughness of one side of the first metallic film, the one side contacting the first resin film, and the surface roughness of the one side of the second metallic film is larger than the surface roughness of the one side of the first metallic film.

Alternatively, the method further includes: mounting the external electric device on the multi-layer substrate in such a manner that the electrode of the external electric device is connected to the surface conductive pattern through a solder member after the step of heating and pressurizing.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A multi-layer substrate connecting to an external electric device, the substrate comprising:
   a plurality of resin films having electric insulation property;
   a plurality of conductive patterns disposed on the resin films; and
   a connection member in a through hole, which is disposed in one of the resin films, wherein
   the resin films are stacked together with the conductive patterns,
   the conductive patterns include an inner conductive pattern and a surface conductive pattern,
   the inner conductive pattern is disposed inside of the multi-layer substrate so that the inner conductive pattern provides an inner circuit,
   the surface conductive pattern is exposed on the multi-layer substrate so that the surface conductive pattern is capable of connecting to the external electric device,
   the surface conductive pattern has a thickness in a stacking direction perpendicular to the multi-layer substrate, the thickness of the surface conductive pattern is thicker than a thickness of the inner conductive pattern in the stacking direction, the connection member is arranged between the surface conductive pattern and the inner conductive pattern so that the connection member electrically couples the surface conductive pattern and the inner conductive pattern, the connection member is made of sintered conductive paste;

the surface conductive pattern is partially embedded in a corresponding resin film, the resin films includes a first resin film and a second resin film, the first resin film is made of thermoplastic resin, the surface conductive pattern is disposed on the second resin film, the inner conductive pattern is disposed on the first resin film, the second resin film includes a first layer and a second layer, the first layer contacts the surface conductive pattern, the first layer is made of thermoplastic resin having a melting point higher than the first resin film, and the second layer is made of the same material as the first resin film.

2. The substrate according to claim 1, wherein
the surface conductive pattern has a surface roughness of one side of the surface conductive pattern, the one side contacting the resin film, and
the surface roughness of the one side of the surface conductive pattern is larger than a surface roughness of the inner conductive pattern.

3. The substrate according to claim 2, wherein
the inner conductive pattern includes a high frequency circuit construction providing a high frequency circuit as the inner circuit.

4. The substrate according to claim 3, wherein
the high frequency circuit construction includes a strip conductive pattern and a pair of ground conductive patterns,
the strip conductive pattern is sandwiched between a pair of the ground conductive patterns through the resin film, and
the high frequency circuit construction is a strip line construction.

5. The substrate according to claim 3, wherein
the high frequency circuit construction includes a strip conductive pattern and a ground conductive pattern,
the strip conductive pattern faces the ground conductive pattern through the resin film, and
the high frequency circuit construction is a micro-strip line construction.

6. The substrate according to claim 1, wherein
the second resin film has a heat resistance, which is higher than a heat resistance of the first resin film.

7. The substrate according to claim 1, wherein
the surface conductive pattern provides only a land for connecting to an electrode of the external electric device, and
the inner conductive pattern provides only a wiring of the inner circuit.

8. The substrate according to claim 7, wherein
the surface conductive pattern is connected to the electrode of the external electric device with a solder member.

9. The substrate according to claim 1, wherein
the thickness of the surface conductive pattern is equal to or more than twice thicker than the thickness of the inner conductive pattern in the stacking direction.

10. The substrate according to claim 1, wherein
the resin film includes a first resin film and a second resin film,
the first resin film is made of liquid crystal polymer having a first melting point,
the second resin film is made of liquid crystal polymer having has a second melting point, which is higher than the first melting point,
the surface conductive pattern is disposed on the second resin film, and
the inner conductive pattern is disposed on the first resin film.

11. The substrate according to claim 1, wherein
the inner conductive pattern disposed inside of the multi-layer substrate so that the inner conductive pattern provides an inner circuit includes a strip conductive pattern and a ground conductive pattern so that a strip line construction is formed.

12. The substrate according to claim 1, wherein
the surface conductive pattern is not completely embedded in the corresponding resin film when the conductive paste in the through hole is sintered and shrunk.

* * * * *